United States Patent
Iriguchi et al.

(10) Patent No.: US 8,456,854 B2
(45) Date of Patent: Jun. 4, 2013

(54) METHOD OF REPAIR OF ELECTRONIC DEVICE AND REPAIR SYSTEM

(75) Inventors: Shigeo Iriguchi, Kawasaki (JP);
Kiyoyuki Hatanaka, Kawasaki (JP);
Satoshi Watanabe, Kawasaki (JP);
Nobuo Taketomi, Kawasaki (JP);
Keiichi Yamamoto, Kawasaki (JP);
Masaru Sugie, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 846 days.

(21) Appl. No.: 12/285,632

(22) Filed: Oct. 9, 2008

(65) Prior Publication Data

US 2009/0175010 A1    Jul. 9, 2009

(30) Foreign Application Priority Data

Jan. 8, 2008    (JP) .................................. 2008-001402

(51) Int. Cl.
*H05K 7/02* (2006.01)
*H05K 7/06* (2006.01)
*H05K 7/08* (2006.01)
*H05K 7/10* (2006.01)

(52) U.S. Cl.
USPC ............................. 361/760; 361/782; 361/785

(58) Field of Classification Search
USPC ............. 361/782–784, 794–795; 29/842–852
See application file for complete search history.

(56) References Cited

U.S. PATENT DOCUMENTS

| 5,384,434 | A | * | 1/1995 | Mandai et al. | 174/258 |
| 5,909,350 | A | * | 6/1999 | Anthony | 361/118 |
| 6,091,310 | A | * | 7/2000 | Utsumi et al. | 333/12 |
| 6,114,674 | A | * | 9/2000 | Baugh et al. | 219/543 |
| 6,148,500 | A | * | 11/2000 | Krone et al. | 29/602.1 |
| 7,319,599 | B2 | * | 1/2008 | Hirano et al. | 361/763 |
| 2006/0291177 | A1 | * | 12/2006 | Choi et al. | 361/780 |

FOREIGN PATENT DOCUMENTS

| JP | 60-189292 | 9/1985 |
| JP | 3-254182 | 11/1991 |
| JP | 09-283915 | 10/1997 |
| JP | 11-135895 | 5/1999 |
| JP | 2000-183513 | 6/2000 |
| JP | 2001-044616 | 2/2001 |
| JP | 2006-332120 | 12/2006 |

OTHER PUBLICATIONS

Japanese Office Action mailed Dec. 6, 2011 issued in corresponding Japanese Patent Application No. 2008-001402.

* cited by examiner

*Primary Examiner* — Tuan T Dinh
(74) *Attorney, Agent, or Firm* — Fujitsu Patent Center

(57) ABSTRACT

A repair system which prevents heating of weakly heat resistant devices together and causing deterioration of the quality when preheating a first surface of the circuit board, wherein an electromagnetic induction material is buried in advance inside the circuit board near a specific electronic device envisioned as needed repair when becoming a defective electronic device in a production process and an electromagnetic coil emitting electromagnetic waves to an electromagnetic induction member in the vicinity of the repair device is provided and the heat generated by the electromagnetic induction member due to the electromagnetic waves enables the repair device to be heated and detached from the circuit board.

4 Claims, 10 Drawing Sheets

RELATED ART

METHOD OF REPAIR OF ELECTRONIC DEVICE AND REPAIR SYSTEM

FIELD

The embodiments discussed herein are related to a method and system for repair which detaches an electronic device from a circuit board mounting electronic devices.

BACKGROUND

The mounting density of electronic devices on a circuit board in a circuit board unit comprised of a circuit board on which a plurality of electronic devices are mounted has been rising in recent years. On the other hand, the electronic devices have also been evolving so as to be compatible with the higher densities. One way in which they have evolved is the broader use of ball grid arrays (BGAs), chip size packages (CSPs), and other large sized electronic devices. These large sized electronic devices are multi-pin devices. Most are structures with a large number of groups of terminals on the bottom surfaces (base surfaces) of the devices. These are effective for saving space, so they are starting to be used in large numbers in mobile phones, notebook PCs, etc.

However, BGAs and other large sized electronic devices are extremely expensive since they contain CPUs and other circuit modules in a high density. Therefore, when for example a problem is discovered at the connection portion between a large sized electronic device and the circuit board in the mounting process of the circuit board unit, the practice has been to not scrap the circuit board unit, but to detach the device in question once from the circuit board, make predetermined repairs, then reconnect it by soldering.

Detachment of an electronic device from a circuit board in this way is generally called "repair". If the electronic device to be detached is a large sized electronic device (BGA etc.), since that device is large in size and has multiple pins, its heat capacity is large and repair is therefore not so easy. Further, in recent years, the general practice has been to use lead-free solder as the above solder. Compared with the conventional lead-based solder, repair is no longer so easy.

In this way, with repair becoming more difficult than the past, the general practice has been to perform repairs using a rework machine designed exclusively for repair. This is called a "repair system".

Note that as known art relating to the present invention explained below, there are Japanese Patent Publication No. 11-135895, Japanese Patent No. 3470953, and Japanese Patent Laid-open Publication No. 9-283915.

A conventional repair system will be explained in detail with reference to FIG. 15. This is configured by a preheating device for preheating a soldered joint of an electronic device to be repaired mounted on a first surface (front) of the circuit board (hereinafter also referred to as a "repair device") by a bottom heater from a second surface (back) of the circuit board and a main heating device for heating the preheated repair device concentrately by a top heater from the first surface of the circuit board. By the main heating by the top heater, the solder at the soldered joint of the repair device melts and the repair device can be taken off the circuit board.

In such a conventional repair system, as explained by the later explained FIG. 15, there are two problems. The first problem is the problem that the quality of the devices mounted on the surface (second surface) at the opposite side to the surface where the repair device is mounted ends up being degraded by the high temperature heating by the top heater.

The second problem is the problem that due to the high temperature heating by the bottom heater, the circuit board (for example, made of glass epoxy) reaches the glass transition temperature (Tg) and the circuit board as a whole ends up "warping". This lowers the reliability of the soldered joints.

SUMMARY

Accordingly, it is a first object of the present embodiment is to provide a method of repair not causing deterioration of the quality of an electronic device (first problem), a repair system, a circuit board unit, and a method of production of a circuit board unit.

Further, in addition to the first object, a second object is to provide a circuit board unit able to suppress warping of the circuit board (second problem).

Note that Japanese Laid-open Patent Publication No. 11-135895, Japanese Patent No. 3470953, and Japanese Laid-open Patent Publication No. 9-283915 all disclose technology for "soldering" an electronic device to a circuit board. They are not art, like the present invention, for "detaching" a soldered electronic device as a repair device from a circuit board.

The method of repair disclosed in the present specification buries an electromagnetic induction material inside the circuit board near the repair device in advance and, at the time of repair, emitting electromagnetic waves from an electromagnetic coil so as to make the electromagnetic induction material generate heat and heat the repair device.

The repair system disclosed in the present specification is provided with an electromagnetic coil emitting electromagnetic waves to an electromagnetic induction material buried inside the circuit board near the repair device to as to make it generate heat and a heating controller running a predetermined high frequency current to this electromagnetic coil.

Further, the circuit board unit disclosed in the present specification has an electromagnetic induction material inside the circuit board near the repair device.

Still further, the method of production of a circuit board unit disclosed in the present specification is comprised of a step of mounting a plurality of electronic devices including a repair device on a circuit board, a step of inspecting the electronic devices after mounting for appearance and electrical characteristics, and a repair step of detaching a repair device found to have an abnormality by this inspection from the circuit board. The heating of the repair device in the repair step is performed by emitting electromagnetic waves from an electromagnetic coil to an electromagnetic induction material buried inside the circuit board near the repair device to make it generate heat.

According to the repair method disclosed in the present specification, when preheating a repair device soldered to a first surface (front) of the circuit board from a second surface (rear), the second surface (rear) is not exposed to that high temperature like in the past. In the past, the practice had been to perform the preheating using the bottom heater, so the entire rear surface had been exposed to a high temperature.

On the other hand, according to the repair method disclosed in the present specification, since electromagnetic waves emitted toward the repair device are used as the heat source, the entire rear surface will never be exposed to a high temperature like in the above. At this time, the surface is locally heated to a high temperature at just the repair device arranged near the electromagnetic induction material.

Therefore, the quality of a weakly heat resistant device mounted on the rear surface (for example, an electrolytic capacitor etc.) is never degraded.

Still further, according to the method of repair disclosed in the present specification, the entire rear surface is never exposed to a high temperature at the time of preheating like in the past, so the circuit board never "warps". This is because only local heating by the electromagnetic induction material is involved. In this case, as explained later, if adding a heat dissipating material around this electromagnetic induction material, the rapid change in temperature between the heat generating part and the nonheat generating part is eased and the "warping" can be more effectively suppressed.

BRIEF DESCRIPTION OF DRAWINGS

These and other objects and features of the embodiments will become clearer from the following description of the embodiments given with reference to the attached drawings, wherein.

DESCRIPTION OF EMBODIMENTS

Before describing the embodiments, the related art and the disadvantages therein will be described with reference to the related figures. To clarify the effect of the repair system disclosed here more, first, the conventional repair system will be explained.

Figure 15:
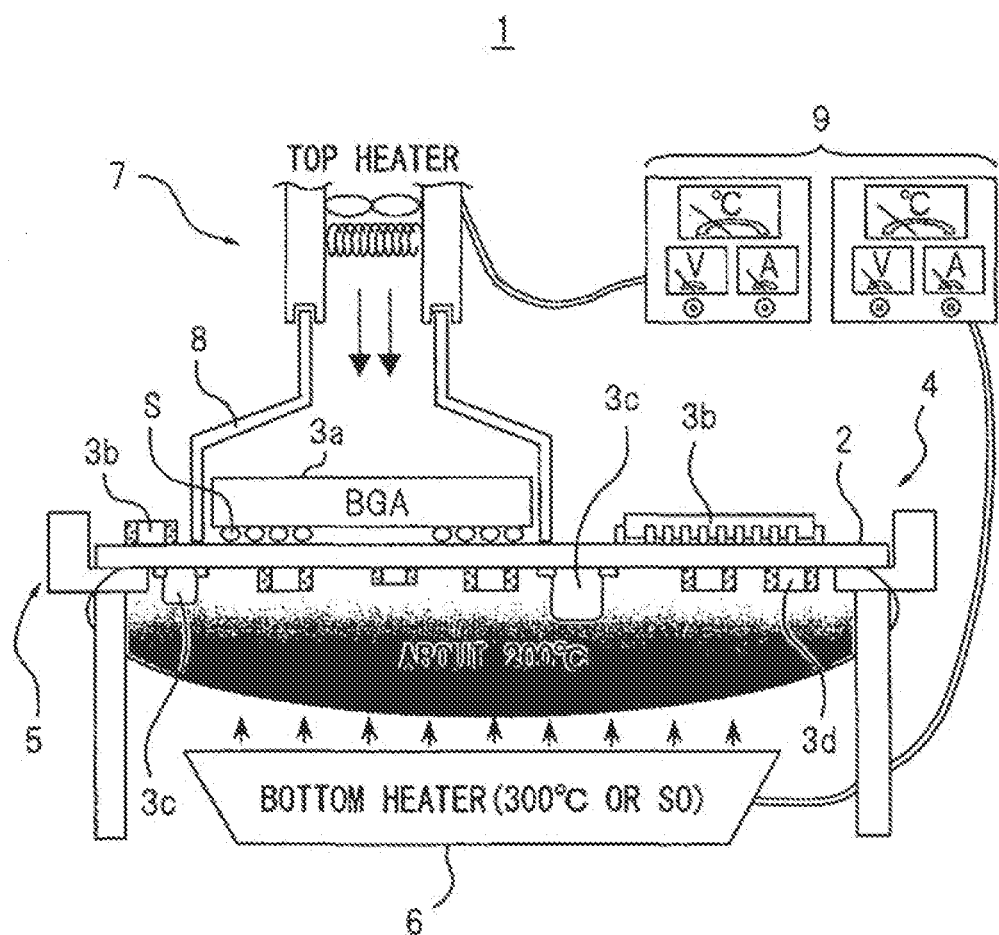
FIG. 15 is a view illustrating a conventional repair system 1.

FIG. 15 is a view illustrating a conventional repair system 1. In this figure, a first surface (front) of the circuit board 2 has a plurality of electronic devices 3a, 3b (for simplification, only three shown) mounted on it. Among these, 3a shows the above-mentioned BGA as one example of a large sized device (repair device) to be repaired. On the other hand, 3b shows an electronic device (IC) usually generally not repaired.

The second surface (rear) of the circuit board 2 has a plurality of electronic devices 3c, 3d (for simplification, seven shown) mounted on it. Among these, 3c shows an electrolytic capacitor as one example of a device which is weakly heat resistant and not repaired, while 3d shows a resistor as one example of a general device which is not repaired. Due to the above members 2 and 3a to 3d, the circuit board unit 4 is formed. The circuit board unit 4 is supported and fixed substantially horizontally by a support 5.

The second surface (bottom) of the circuit board 2 has the bottom heater 6 arranged on it. The first surface (top) has the top heater 7 arranged on it. At the top heater 7, a dedicated cover 8 for centrally heating the repair device 3a is attached.

The powers of the bottom heater 6 and the top heater 7 are controlled by the heat controller 9.

Explaining this in further detail, the circuit board unit 4 is fixed inside a so-called rework machine provided with a bottom heater 6 for preheating and a top heater 7 for the main heating. First, the bottom heater 6 is used to preheat the solder joint S from the reverse surface from the repair device 3a to a temperature of about 70 to 100° C. This preheating becomes the heat source required for reliably heating in a short time so that heat does not escape from the board 2 at the time of the main heating.

Further, the bottom heater 6 becomes a size of an extent enabling the entire circuit board unit 4 to be heated so as to enable devices mounted at various positions of various circuit board units 4 to be heated.

After using the bottom heater 5 for preheating, while continuing the heating, the top heater 7 is used for main heating the solder joint S from the mounting surface of the repair device 3a up to the solder melting temperature of 230 to 240° C. and detaching the device 3a from the board 2.

This main heating is the heat source for melting the solder of the device 3a to be repaired. To more centrally heat the device 3a, the main heating is performed while attaching a dedicated cover 8 for each package.

When preheating the soldered joint S of the repair device 3a, the bottom heater 6 is used for gradually heating from the opposite side from the repair device 3a. To heat the soldered joint S up to 70 to 100° C., the bottom heater 6 itself has to be heated by a power close to 300° C.

Further, at that time, the surface of the board at the opposite side to the surface where the repair device 3a is mounted and the mounted devices 3c and 3d are exposed to a temperature of close to 200° C. In particular, the quality of weakly heat resistant devices is sacrificed.

Further, the entire circuit board 2 is heated by a heat exceeding the Tg temperature, so there is the problem that the entire circuit board will warp. This is liable to impair the reliability of the device joint S.

From the above, at the time of repair of a device, heat ends up being conducted to the devices 3c, 3d other than the device 3a concerned. Problems such as defects in the devices due to the heat or a drop in joint reliability due to warping of the board are liable to be incurred.

Further, lead-free solder is increasingly being used, but the heating temperature required for melting such solder tends to be much higher, so reliable efficient heating in a short time becomes necessary.

Due to the above, the method of repair disclosed in this specification enables local heating and can suppress the thermal stress on the devices surrounding the repair device. For this purpose, preheating is realized by a repair system 10 provided with an electromagnetic induction coil and a circuit board unit partially (locally) provided with an electromagnetic induction material in the circuit board directly under the repair device 3a.

Figure 1:
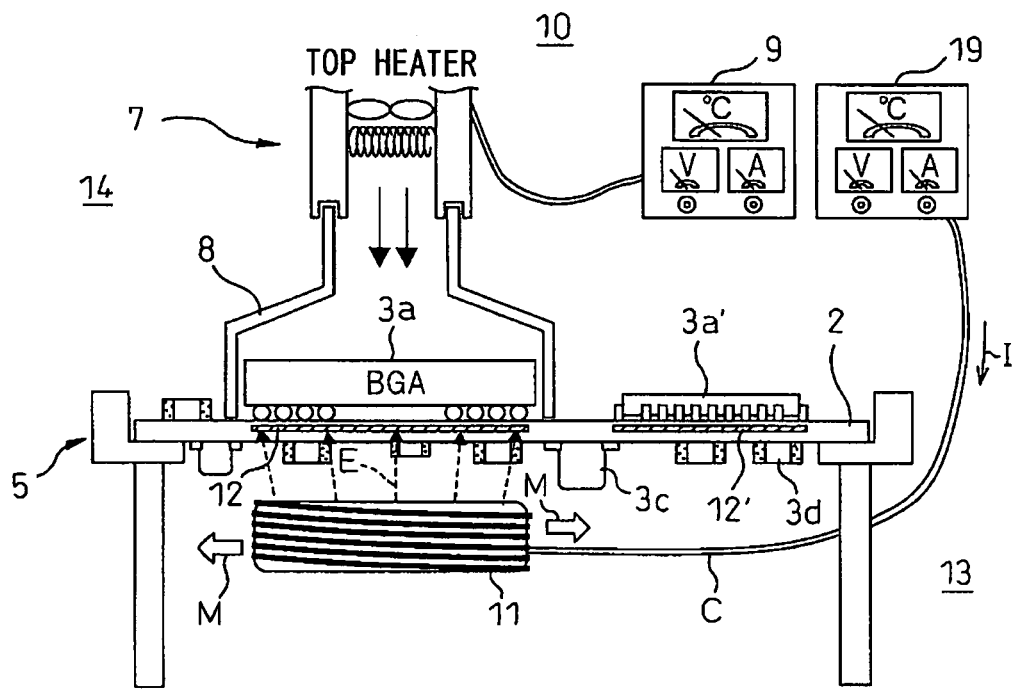
FIG. 1 is a view illustrating a first embodiment of a repair system 10 disclosed by the present specification.

FIG. 1 is a view illustrating a first embodiment of a repair system 10 disclosed by the present specification. Note that similar component elements are assigned the same reference numerals or symbols throughout the figures.

In the figure, the repair system 10 according to the present embodiment is a repair system detaching from a circuit board 2 at least one specific electronic device 3a (3a') among a plurality of electronic devices 3a, 3a' to 3d mounted on a first surface (top surface) of the circuit board 2, provided with an electromagnetic coil 11 serving as a heat source for removing from the circuit board 2 specific electronic devices 3a, 3a' soldered to the circuit board 2 and a heat controller 19 controlling the high frequency current I running through this electromagnetic induction coil 11. Here, the circuit board unit 4 including the specific electronic device to be repaired is comprised of the circuit board 2, a plurality of electronic devices mounted on the circuit board 2 and including at least one specific electronic device 3a (3a') to be detached at the time of repair, and an electromagnetic induction material 12 (12') buried in the circuit board 2 near the specific electronic device.

The electromagnetic induction coil 11 paired with the electromagnetic induction materials 12, 12' can be moved as shown by the arrows M to positions emitting electromagnetic waves to the electromagnetic induction materials 12, 12' buried inside the circuit board near the specific electronic devices 3a, 3a'. For that reason, for example, the coil 11 and the heating controller 19 are connected by a flexible cable C.

Therefore, a repair system is realized from (i) a preheating device 13 for preheating a specific electronic device 3a (3a') by an electromagnetic induction coil 11 and a heating controller 19 and (ii) a main heating device 14 for main heating a specific electronic device 3a (3a') by a heater 7 concentrately heating the preheated specific electronic device and a heating controller 9 controlling the feed current of the heater 7. The heating controller 19 can be configured to control the current value and/or the frequency of the high frequency current I. This is because the amount of heat generated by the electromagnetic induction materials 12, 12' by the high frequency current I can not only be changed by the magnitude of the current value of the high frequency current, but can also be changed by the level of the current.

A new method of repair is provided in the present specification. That is, there is provided a method of repair detaching from a circuit board 2 at least one specific electronic device 3a (3a') among a plurality of electronic devices mounted on a first surface of the circuit board 2 (top side), comprising (i) a first step of burying an electromagnetic induction material 12 (12') inside the circuit board 2 near the specific electronic device and (ii) a second step of emitting an electromagnetic wave E from an electromagnetic induction coil 11 to the electromagnetic induction material 12 (12').

The method further has, after the preheating step of the specific electronic device by the second step (ii), (iii) a third step of a main heating step for further concentrately heating the preheated specific electronic device. In this case, the second step (ii) is performed at a second surface side (bottom side) of the circuit board 2. The third step (iii) is performed at a first surface side (top side) of the circuit board.

Figure 2:
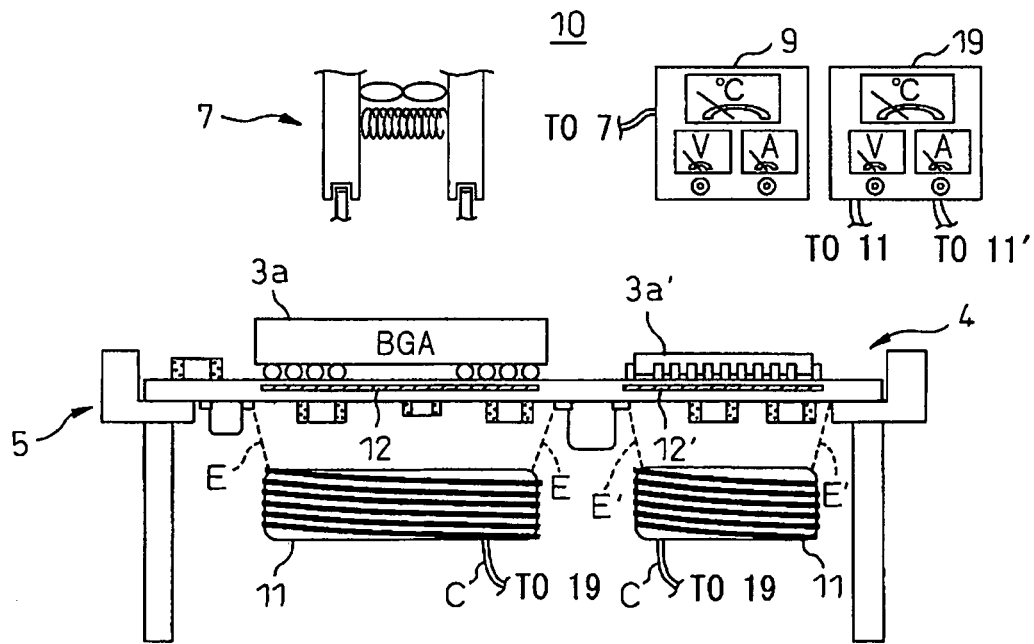
FIG. 2 is a view illustrating a second embodiment of a repair system 10.

FIG. 2 is a view of a second embodiment of the repair system 10. As shown in FIG. 1, the specific electronic device mounted on one circuit board 4 is not limited to one. Two or more may be mounted. Further, sometimes the shapes or sizes of the specific electronic devices differ. In such a case, if referring to the above-mentioned repair method, when there are a plurality of specific electronic devices (3a, 3a'), at the first step (i), the electromagnetic induction materials (12, 12') are provided corresponding to the respective specific electronic devices and different amounts of heat are generated at the specific electronic devices.

By selectively using the pairs of electromagnetic induction materials and electromagnetic induction coils for each specific electronic device, it is possible to greatly improve the heating efficiency of the repair system.

For this reason, first, electromagnetic induction materials 12, 12' in the circuit board unit 4 are made sizes equal to the specific electronic devices 3a, 3a', while the electromagnetic induction coils 11, 11' are given external shapes for emitting electromagnetic waves E, E' having widths covering the areas of the electromagnetic induction materials 12, 12'. Therefore, the electromagnetic induction coils 11, 11' are made electromagnetic induction coils emitting a plurality of types of electromagnetic waves E, E' having widths covering various areas of the electromagnetic induction materials 12, 12' for each area.

Figure 3:
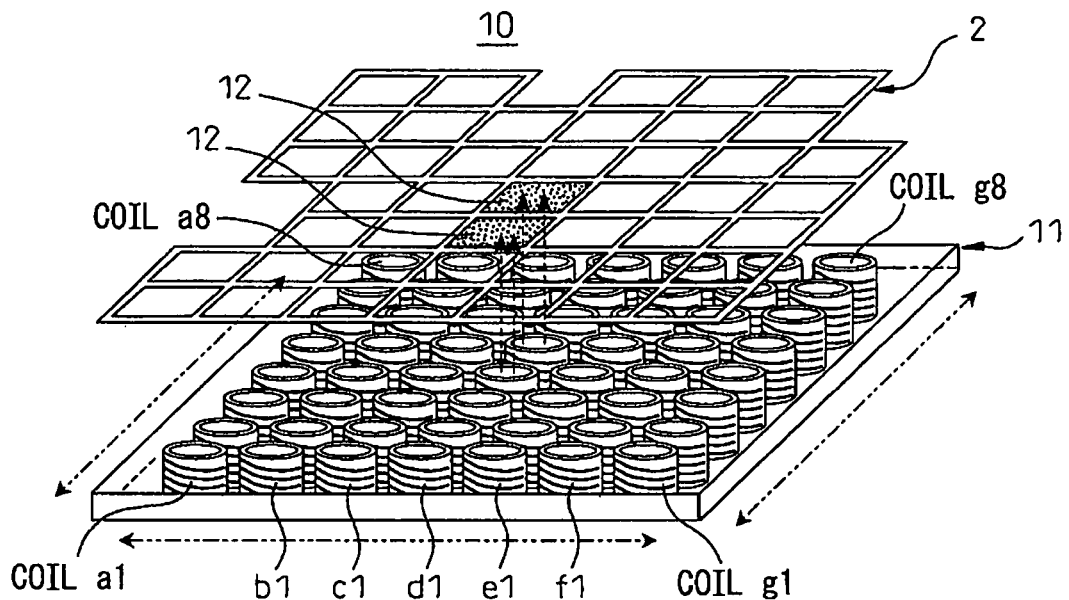
FIG. 3 is a view illustrating a third embodiment of a repair system 10.

FIG. 3 is a view illustrating a third embodiment of the repair system 10. However, only the electromagnetic induction coils 11 and the electromagnetic induction materials 12 are shown. The electromagnetic induction materials 12 in the circuit board 4 of the present embodiment are comprised of a plurality of small pieces corresponding to a plurality of small electromagnetic induction coils 11 (a1 to g8). These are arranged in a predetermined region in the circuit board 2 including at least the specific electronic device and its vicinity.

In general, at the design stage of the circuit board unit 4, the layout of the specific electronic devices (3a, 3a') predicted as becoming repair devices on the circuit board 2 and their sizes and shapes are known in advance. Therefore, the sizes, shapes, and layout of the electromagnetic induction materials 12 can also be determined in advance. The sizes suitable for these electromagnetic induction materials 12 can also be determined in advance.

In this regard, at the stage of production of the circuit board 2, sometimes it is not known what kind of electronic devices are arranged at what positions. In such a case, the large number of small pieces of the electromagnetic induction materials 12 are buried in the circuit board 2 in advance. On the other hand, the electromagnetic induction coils 11 include a group of small coils corresponding to the small pieces. After this, at the time of production of the circuit board unit 4, that is, at the step where the position of the device which may require repair is finally determined and repair of that device becomes necessary, the small coils (a1 to g8) facing the repair device are selectively excited.

Figure 4:
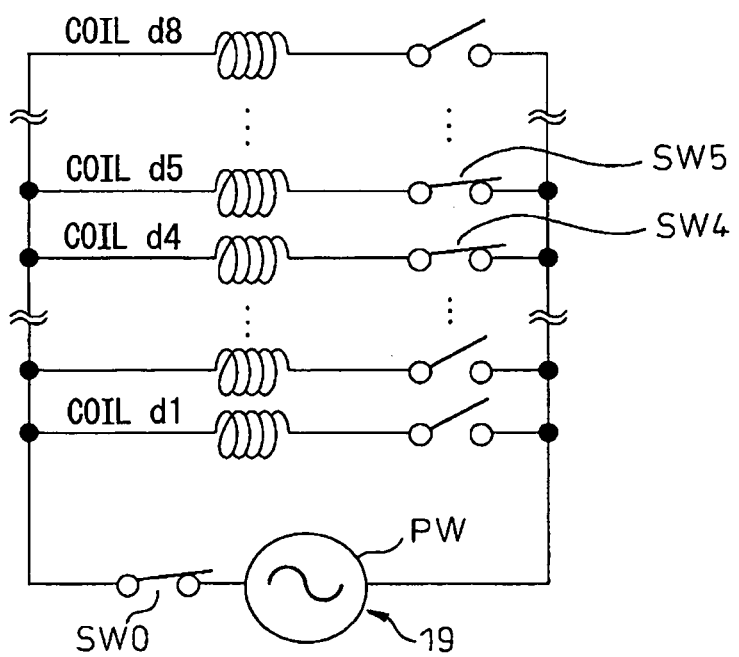
FIG. 4 is a view illustrating selective electromagnetism of a group of small coils.

FIG. 4 is a view illustrating the selective excitation of the group of small coils. As one example, the case of selectively exciting two small electromagnetic induction materials 12 shown in FIG. 3 is shown. In the figure, at the time of repair, the main switch SW0 of the power source PW in the heating controller 19 is turned on and the corresponding switches SW4 and SW5 for exciting only the small coils d4 and d5 facing the two small pieces of the electromagnetic induction material 12 are turned on. Even when there are two or more different repair devices, it is sufficient to turn on the switches (SW) of the small coils corresponding to the repair devices.

Due to the above embodiment enabling local heating, it is possible to eliminate the problem of even weakly heat resistant devices ending up being heated together at the time of preheating by the bottom heater 6. Further, it would be convenient if able to greatly suppress "warping" due to heating of the circuit board 2.

Therefore, in the following embodiment, if taking as an example the above-mentioned repair method, at the second step (ii), the heat from the electromagnetic induction materials 12, 12' generated by the electromagnetic waves E, E' is gradually dissipated, from the center of the electromagnetic induction materials to the outside so as to suppress "warping" of the board 2.

Figure 5:
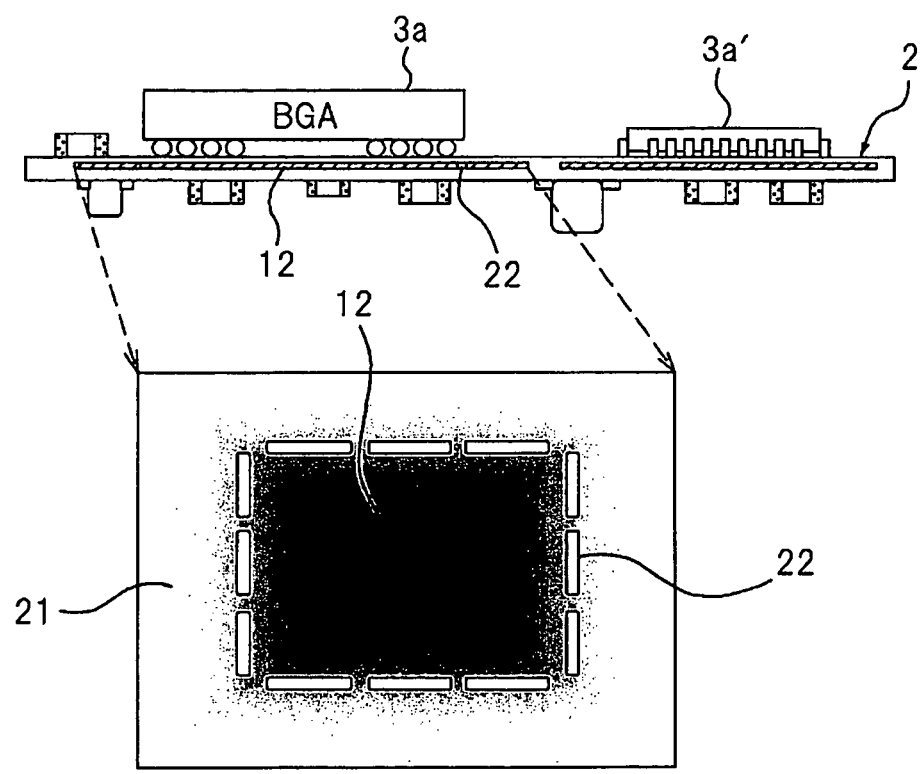
FIG. 5 is a view illustrating a first embodiment of a circuit board unit 4, in particular an electromagnetic induction material 12.

FIG. 5 is a view illustrating a first embodiment of the circuit board unit 4, in particular an electromagnetic induction material 12. As shown in figure, the electromagnetic induction material 12 has a heat dissipation member 21 arranged integrally with this electromagnetic induction material 12 so as to surround this electromagnetic induction material 12. Note that in the example of this figure, the heat dissipation member 21 is formed by the same member as the electromagnetic induction material 12 (for example, an iron-based sheet), slits 22 are formed between the two, and heat of the center (12) is dissipated gradually to the outside.

In the fifth embodiment and the subsequent embodiments, the heat of the center (12) is dissipated to the outside in the structures, so the amount of heat generated at the center (12) part should be increased as much as possible. One example is illustrated.

Figure 6:
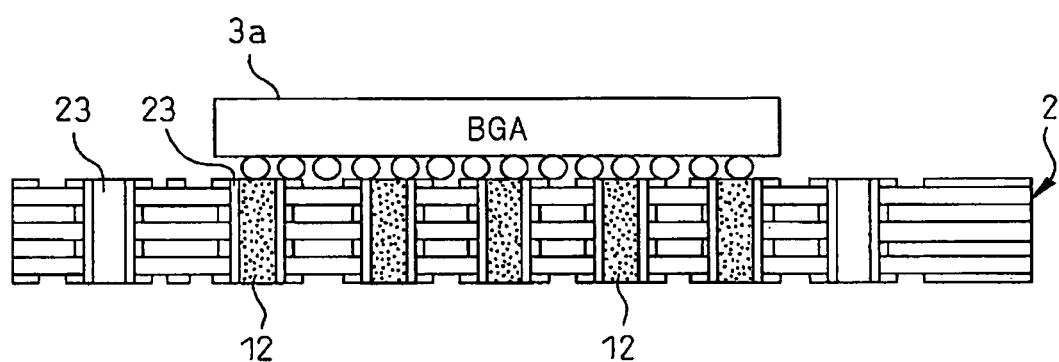
FIG. 6 is a view illustrating an example for further increasing the amount of heat generated at the center part of the repair device.

FIG. 6 is a view illustrating an example for further increasing the amount of heat generated at the center part of a repair device. That is, as shown in the figure, an electromagnetic induction material 12 is buried in through vias (vias) 23 in the circuit board 2. The vias 23 are used when switching the interconnect layers or when interconnecting the GND layer. For this reason, in the case of BGA or CSP devices etc. having large numbers of power pins and from which interconnects are hard to lead out, a large number of vias 23 are provided right under the device. Utilizing this feature and heating the electromagnetic induction material 12 buried in the vias 23 and increased more in volume, it is possible to obtain a larger amount of heat generation. Further, the electromagnetic induction material 12 buried in the vias 23 has electrical conductivity, so it is possible to increase the conductive volume as part of the vias. This leads to an increase in the DC current capacity.

Figure 7:
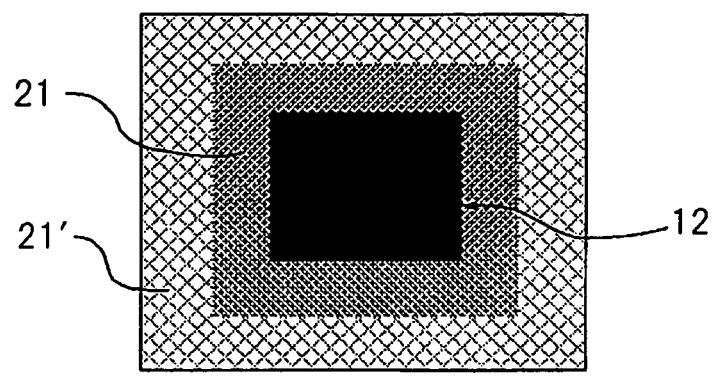
FIG. 7 is a view illustrating a second embodiment of an electromagnetic induction material 12.

FIG. 7 is a view illustrating a second embodiment of the electromagnetic induction material 12. The heat dissipation member 21 of this figure is formed to exhibit a temperature gradient giving a gradually lower temperature the further from the high temperature electromagnetic induction material 12 side heated at the time of repair.

Specifically, by making the bonding terminal region of the electromagnetic induction material 12 directly under the repair device (3a) a solid shape and making the surrounding heat dissipation region (21) a mesh shape, the surface contacting the board is increased and the heat dissipation efficiency becomes better. Further, this mesh region is made coarser the further to the outside, whereby the heating temperature conducted to the board is lowered and a gentle temperature gradient can be given to the board temperature around the repair device and therefore the thermal stress can be weakened.

Figure 8:
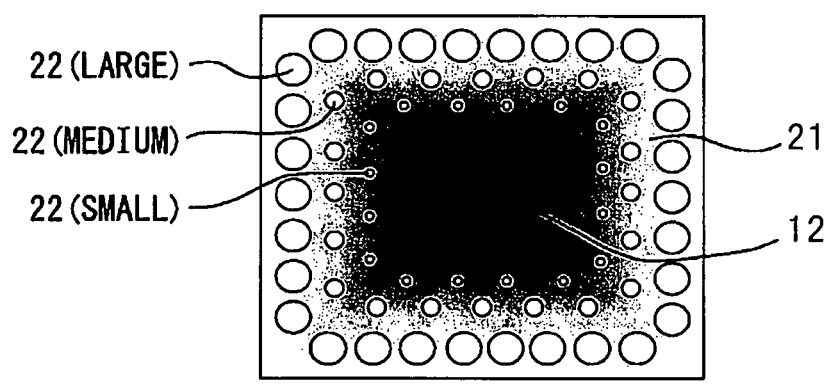
FIG. 8 is a view illustrating a third embodiment of an electromagnetic induction material 12.

FIG. 8 is a view illustrating a third embodiment of the electromagnetic induction material 12. In this figure, the heat dissipation region 21 is made of circular relief slits 22. The diameter of the circular relief slits is increased the more to the outside (22 (small)→(medium)→(large)). In the same way as the case of heat dissipation by a mesh shape, it is possible to lower the heating temperature conducted to the board the more toward the outer circumference and possible to give a gentle temperature gradient. Further, by making the heat dissipation region out of circular relief shapes rather than a mesh shape, the sharp parts are eliminated and the production efficiency of the slits can be improved.

Figure 9:
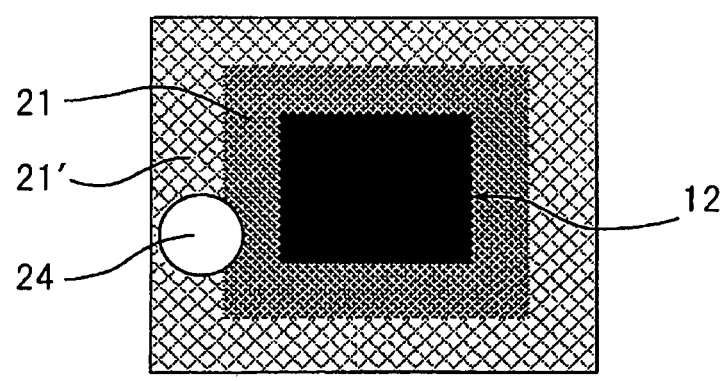
FIG. 9 is a view illustrating a fourth embodiment of an electromagnetic induction material 12.

FIG. 9 is a view illustrating a fourth embodiment of the electromagnetic induction material 12. In the case where a weakly heat resistant device is mounted near the specific electronic device, when the heat generating parts (21, 21') face the weakly heat resistant device (3c), a circular relief part 25 is formed in advance. As one such weakly heat resistant device (3c), there is an aluminum electrolytic capacitor. If heat is excessively given to it, the electrolytic solution inside the device spoils and deterioration in the device characteristics is invited. For this reason, it is possible to keep the heat applied to the weakly heat resistant device to a minimum by the circular relief part 24 and locally preheat the specific electronic device 3a.

Figure 10:
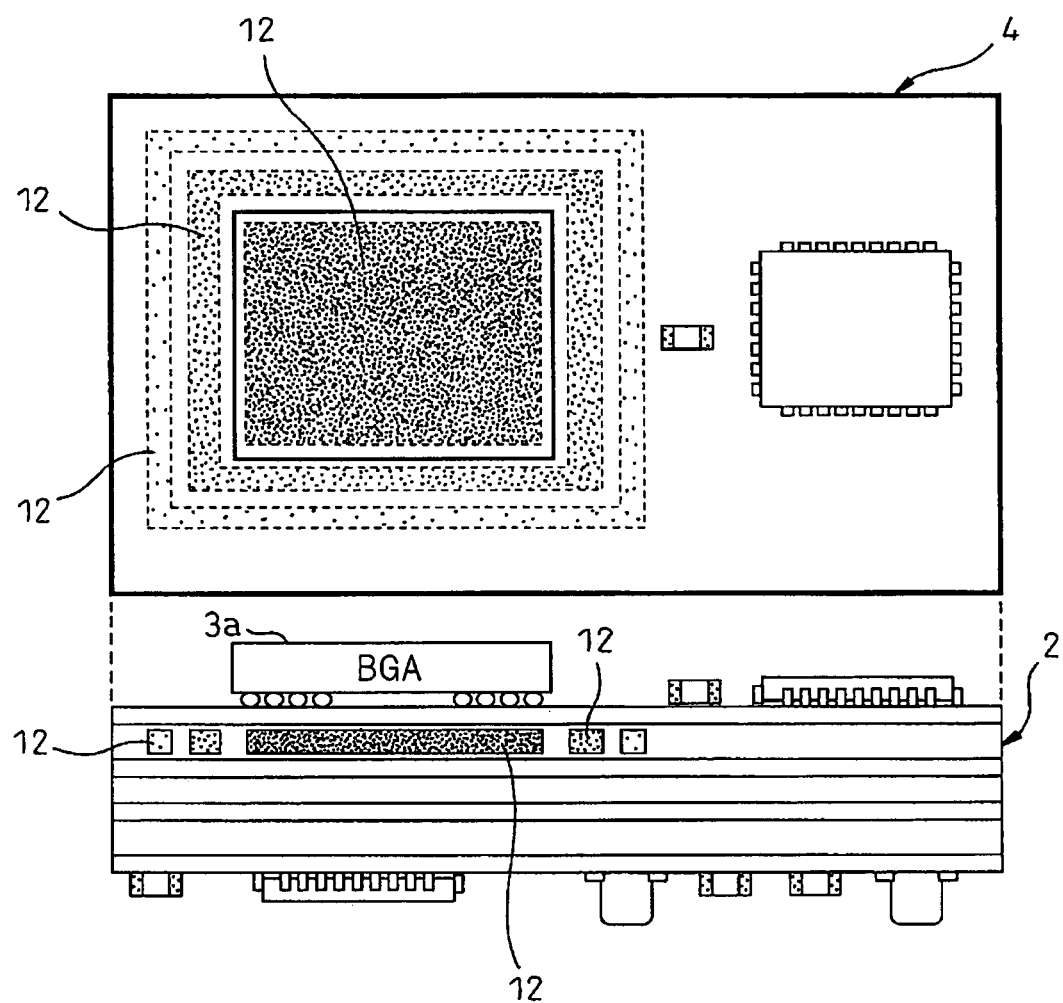
FIG. 10 is a view illustrating a fifth embodiment of an electromagnetic induction material 12.

FIG. 10 is a view illustrating a fifth embodiment of an electromagnetic induction material 12. Around the electromagnetic induction material 12 contained right under a specific electronic device (3a), electromagnetic induction materials 12A and 12C with low heat generation temperatures are provided in a rectangular shape. This makes use of the difference in heat generation temperatures occurring for each material of the electromagnetic induction materials. Due to this, it is possible to give a gentle temperature gradient to the surroundings of the repair device and possible to suppress the local warping of the circuit board 2 by local heating.

Figure 11:
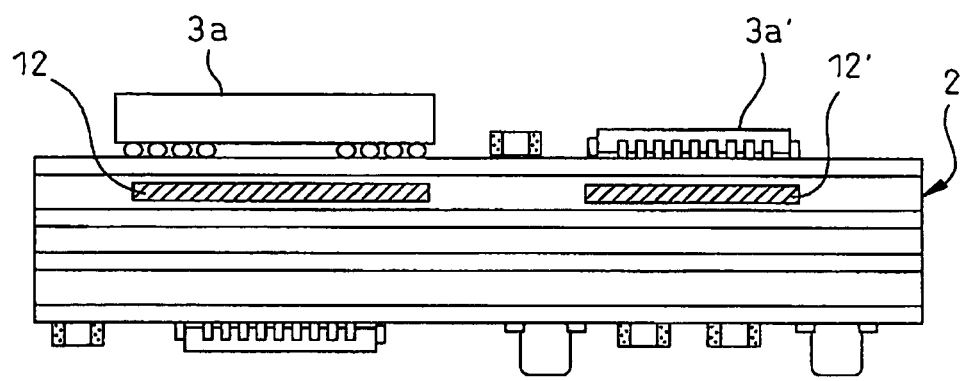
FIG. 11 is a view illustrating a sixth embodiment of an electromagnetic induction material 12.

FIG. 11 is a view illustrating a sixth embodiment of the electromagnetic induction material 12. As shown in figure, electromagnetic induction materials 12, 12' of different materials are selectively used for the specific electronic devices 3a, 3a'. The fact that the heat generation temperature from the electromagnetic induction materials differs according to the difference in materials is utilized. The electromagnetic induction materials are selectively used for separate packages such as using the electromagnetic induction material 12 with a high heat generation temperature for a device 3a with a large heat capacity and using the electromagnetic induction material 12' with a low heat generation temperature for a device 3a' with a small heat capacity. Due to this, it is possible to locally preheat the board suitable for the type of the device.

Figure 12:
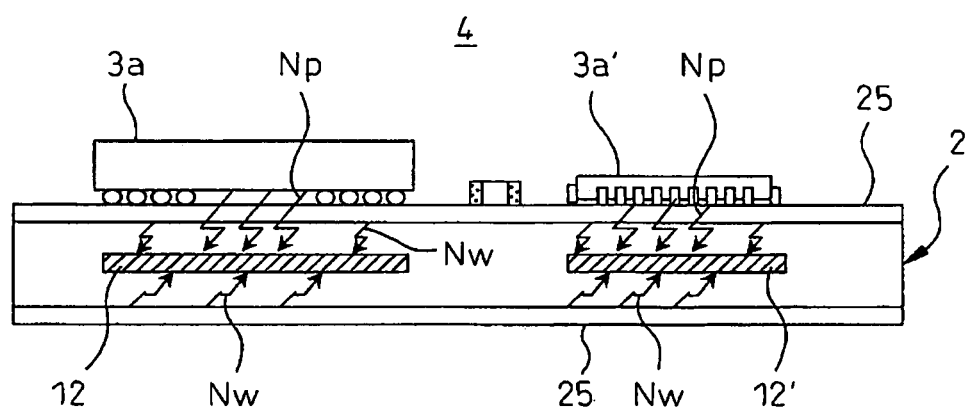
FIG. 12 is a view illustrating the effect of burying an electromagnetic induction material 12 in a circuit board 2.

FIG. 12 is a view illustrating the effects of burying an electromagnetic induction material 12 in the circuit board 2. Due to the presence of the electromagnetic induction material 12, a shield effect can also be expected. In the figure, Np indicates the noise generated from the electronic devices (3a, 3a'), while Nw indicates the noise from the circuit pattern 25.

The electromagnetic induction material 12 used for the preheating at the time of repairing a device also has the effect as a shield. The electromagnetic wave noise Np emitted from the devices (3a, 3a') sometimes jumps into the air and has a detrimental effect on the circuit patterns. The reverse is also true. Further, cross talk among circuit patterns between layers sometimes cause circuit malfunctions. The mutual interference due to the emitted noise can be suppressed by the shield effects of the electromagnetic induction materials 12, 12'. In particular, this is effective as a countermeasure to noise of a BGA, CSP, or other device with a large power consumption due to high speed operation.

Figure 13:
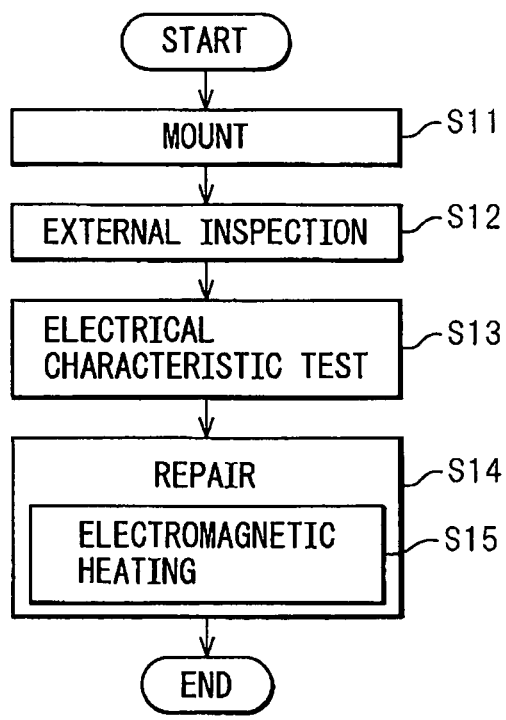
FIG. 13 is a flow chart depicting a method of production of a circuit board unit 4 including an existing method of repair.
Figure 14:
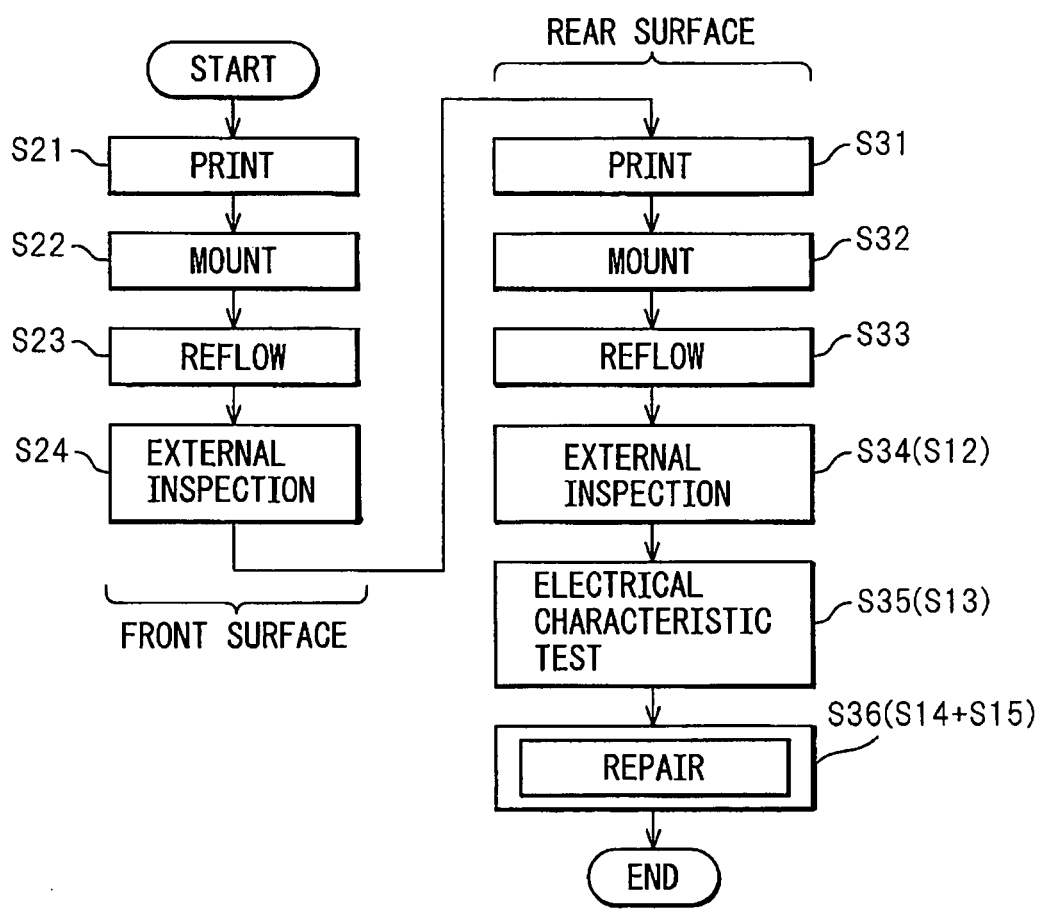
FIG. 14 is a flow chart depicting a more specific method of production than in FIG. 3.

FIG. 13 is a flow chart depicting the method of production of a circuit board unit 4 including the already explained method of repair, while FIG. 14 is a flow chart showing a more specific method of production than FIG. 13.

First, referring to FIG. 13, the method of production is a method of production of a circuit board unit for producing a circuit board unit 4 comprised of a circuit board 2 and a plurality of electronic devices mounted on the circuit board 2 and including at least one specific electronic device 3a (3a') to be detached at the time of repair. Further, the method comprises, on at least one surface of a first surface (front) and a second surface (rear) of this circuit board 2, (i) an electronic device mounting step arranging electronic devices at predetermined positions on the circuit board 2 and fixing the electronic devices at those positions by solder (S11), (ii) an external inspection step inspecting for any defects in appearance of the electronic devices mounted on the circuit board 2 (S12), (iii) a test step testing whether each electronic device mounted on the circuit board 2 has predetermined electrical characteristics (S13), and (iv) a repair step detaching a specific electronic device 3a found to have an abnormality in the external inspection step (S12) and/or test step (S13) from the circuit board 2 (S14), the repair step (S14) including a step of emitting electromagnetic waves from an electromagnetic induction coil 11 to an electromagnetic induction material 12 buried in advance in the circuit board 2 near the specific electronic device 3a (S15).

The repair step (S14) is comprised of a preheating step (13) of the specific electronic device 3a by emission of electromagnetic waves E and a main heating step (14) concentrately heating the preheated specific electronic device 3a.

Next, referring to the more specific FIG. 14, the flow at the left side of the figure (S21 to S24) is the process on the first surface (front surface) of the circuit board 2, while the flow at the right side (S31 to S36) is the process on the second surface (rear surface) of the circuit board 2. However, the printing steps (S21, S31), mounting steps (S22, S32), reflow steps (S23, S33), and external inspection steps (S24, S34) are the same at the front surface and rear surface. Note that the steps S34, S35, and S36 are the same as steps S12, S13, and S14+S15 of FIG. 13.

More specifically, a circuit board unit 4 is produced by the printing steps (S21, S31) of coating a solder cream on the circuit board 2, the mounting steps (S22, S32) of mounting devices on the circuit board, the reflow steps (S23, S33) of melting the solder cream and bonding the devices, the external inspection steps (S24, S34) of confirming the bonds of the solder, the step (S35) of testing the electrical characteristics of the circuit board unit 4 as a whole after finishing mounting, and the repair step (S36) of detaching (and reattaching) a defective device.

The current circuit board units 4 mostly are two-sided mounting types having devices mounted on the two surfaces of the circuit board 2 and require heating of the board 2 by the reflow step two times (S23 and S33). Further, when a defective device occurs, the board is further heated at the repair step S36 and the device is detached (and reattached). A deterioration of the device quality by heat, a drop in the bond reliability, and a deterioration in the board quality are liable to be incurred. To alleviate the damage due to the multiple heating steps, it is effective to employ a repair step by a combination of a repair system 10 provided with an electromagnetic induction coil 11 and a circuit board 2 including an electromagnetic induction material 12.

While the invention has been described with reference to specific embodiments chosen for purpose of illustration, it should be apparent that numerous modifications could be made thereto by those skilled in the art without departing from the basic concept and scope of the invention.

What is claimed is:

1. A method of detaching from a circuit board at least one specific electronic device among a plurality of electronic devices mounted on a first surface of the circuit board, the method comprising:
    burying an electromagnetic induction material inside the circuit board near the specific electronic device; and
    generating an electromagnetic wave to be emitted from an electromagnetic induction coil by supplying high frequency power to the electromagnetic induction coil,
    heating the electromagnetic induction material by applying the emitted electromagnetic wave to the electromagnetic induction material so as to preheat the specific electronic device by the heat from the electromagnetic induction material; and
    detaching the specific electronic device from the circuit board;
    wherein, at the heating, gradually dissipating the heat from the electromagnetic induction material generated by the electromagnetic wave, from the center of the electromagnetic induction material to the outside.

2. The method of detaching an electronic device as set forth in claim 1, further comprising, after the heating the specific electronic device, main heating for further concentrately heating the preheated specific electronic device.

3. The method of detaching an electronic device as set forth in claim 1, wherein when there are a plurality of specific electronic devices, electromagnetic induction materials are provided corresponding to the respective specific electronic devices and different amounts of heat are generated at the specific electronic devices.

4. The method of detaching an electronic device as set forth in claim 2, wherein
    the heating is performed at a second surface side of the circuit board and
    the main heating is performed at a first surface side of the circuit board.

* * * * *